(12) United States Patent
Liu

(10) Patent No.: US 8,044,571 B2
(45) Date of Patent: Oct. 25, 2011

(54) ELECTRODE STACKS FOR ELECTROACTIVE DEVICES AND METHODS OF FABRICATING THE SAME

(75) Inventor: Jie Liu, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 1682 days.

(21) Appl. No.: 11/300,534

(22) Filed: Dec. 14, 2005

(65) Prior Publication Data

US 2007/0131278 A1  Jun. 14, 2007

(51) Int. Cl.
*H01J 1/62* (2006.01)
*H01J 17/24* (2006.01)

(52) U.S. Cl. ........... 313/503; 313/506; 313/558; 445/24

(58) Field of Classification Search ............... 313/503, 313/506; 445/24
See application file for complete search history.

(56) References Cited

U.S. PATENT DOCUMENTS

| | | | | |
|---|---|---|---|---|
| 4,357,557 A | 11/1982 | Inohara et al. | ................. | 313/509 |
| 5,537,000 A * | 7/1996 | Alivisatos et al. | ............. | 313/506 |
| 5,952,778 A | 9/1999 | Haskal et al. | ................. | 313/504 |
| 5,962,962 A | 10/1999 | Fujita et al. | ................. | 313/412 |
| 6,146,225 A | 11/2000 | Sheats et al. | ................. | 445/24 |
| 6,413,645 B1 | 7/2002 | Graff et al. | ................. | 428/446 |
| 6,614,057 B2 | 9/2003 | Silvernail et al. | ................. | 257/99 |
| 6,624,568 B2 | 9/2003 | Silvernail | ................. | 313/504 |
| 6,873,101 B2 | 3/2005 | Nilsson et al. | ................. | 313/512 |
| 6,888,305 B2 | 5/2005 | Weaver | ................. | 313/506 |
| 6,897,607 B2 | 5/2005 | Sugimoto et al. | ............. | 313/506 |
| 6,960,877 B1 * | 11/2005 | Heeks et al. | ................. | 313/512 |
| 2004/0245917 A1 | 12/2004 | Lu et al. | ................. | 313/503 |
| 2005/0017632 A1 * | 1/2005 | Hou et al. | ................. | 313/506 |
| 2005/0056859 A1 | 3/2005 | Liu et al. | ................. | 257/103 |
| 2005/0184650 A1 | 8/2005 | Peng et al. | | |
| 2006/0181199 A1 | 8/2006 | Lee et al. | | |
| 2006/0208632 A1 | 9/2006 | Kang | | |

FOREIGN PATENT DOCUMENTS

| | | |
|---|---|---|
| EP | 1 414 081 A | 4/2004 |
| EP | 1 480 280 A | 11/2004 |
| EP | 1577949 A1 | 9/2005 |
| WO | WO 00/36661 A | 6/2000 |
| WO | WO03/094255 A2 | 11/2003 |
| WO | WO 2004/070845 A | 8/2004 |

* cited by examiner

*Primary Examiner* — Peter Macchiarolo
(74) *Attorney, Agent, or Firm* — Mary Louise Gioeni

(57) ABSTRACT

A cathode stack with a getter layer is disclosed. The cathode stack includes an electron injection layer, a capping layer and a getter layer. An organic electroactive device including a cathode stack with a getter layer is also presented. A method of fabricating an electroactive device with a cathode stack including a getter layer is also provided.

16 Claims, 4 Drawing Sheets

ELECTRODE STACKS FOR ELECTROACTIVE DEVICES AND METHODS OF FABRICATING THE SAME

STATEMENT REGARDING FEDERALLY SPONSORED RESEARCH & DEVELOPMENT

This invention was made with Government support under contract number 70NANB3H3030 awarded by National Institute of Standards and Technology. The Government has certain rights in the invention.

BACKGROUND

The invention relates generally to electrodes for electroactive devices. The invention particularly relates to electrodes for organic electroactive devices.

Organic electroactive devices include organic light emitting devices and organic photovoltaic devices. Organic electroactive devices operate by injection of charges, which combine to result in radiation of energy as in a light emitting device, or by separation of charges as in a photovoltaic device. Efficient operation of electroactive devices depends, among other things, on efficient transport of charges across an interface between an electrode and an adjacent medium.

Metals having low work functions, desirably lower than 4.0 eV such as alkali and alkaline-earth metals, are often used as cathode materials to promote electron injection. Cathode materials such as calcium, lithium, and cesium, used to promote electron injection, are usually reactive metals and are sensitive to moisture and oxygen and degrade upon exposure to the environment. A hermetic seal is thus required to prevent exposure of such cathode materials to oxygen and moisture. Conventionally, devices using these metals as cathode materials are often encapsulated to prevent oxygen and moisture from reaching the active components of the device. Capping layers including less reactive metals, such as aluminum, have also been used to cover and protect layers with such cathode materials. Disadvantageously, capping layers may be prone to pin holes and defects, which allow moisture and oxygen to permeate through to the reactive cathode materials.

Accordingly, a technique is needed to address one or more of the foregoing problems in electroactive devices, such as organic electroactive devices.

BRIEF DESCRIPTION

Briefly, in accordance with aspects of the present technique, a cathode stack for electroactive devices is presented. The cathode stack includes an electron injection layer, a capping layer and a getter layer internal to the cathode stack.

In accordance with further aspects of the present technique, an electroactive device is presented. The electroactive device includes a cathode stack including a getter layer internal to the cathode stack, and at least one electroactive layer.

According to further aspects of the present technique, a method of making a cathode stack including a getter layer is presented. The method includes providing an electron injection layer, a capping layer, and a getter layer in a stacked structure, wherein at least a portion of the capping layer is disposed in contact with at least a portion of the electron injection layer, and wherein at least a portion of the getter layer is disposed in contact with at least a portion of the capping layer According to still further aspects of the present technique, a method of fabricating an organic electroactive including a cathode stack with a gutter layer. The method includes providing a first sub-structure comprising a substrate and at least one electroactive layer and providing a second sub-structure comprising a cathode stack, wherein the second sub-structure is disposed in contact with at least a portion of the first-substructure and wherein the cathode stack comprises an electron injection layer, a capping layer and a getter layer.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
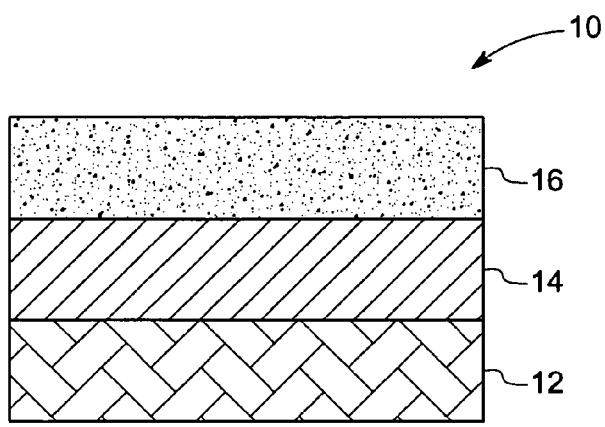
FIG. 1 is a cross-sectional representation of an exemplary embodiment of a cathode stack, according to aspects of the present technique.

Embodiments of the present invention disclose cathode stacks with a getter layer, electroactive devices including such cathode stacks, and methods of making devices with such cathode stacks.

In the following specification and the claims which follow, reference will be made to a number of terms which shall be defined to have the following meanings. The singular forms "a", "an" and "the" include plural referents unless the context clearly dictates otherwise. The term "electroactive" as used herein refers to a material that is (1) capable of transporting, blocking or storing charge (either positive charge or negative charge), (2) light-absorbing or light emitting, typically although not necessarily fluorescent, and/or (3) useful in photo-induced charge generation, and/or (4) of changing color, reflectivity, transmittance upon application of bias. An "electroactive device" is a device comprising an electroactive material. In the present context an electroactive layer is a layer for an electroactive device, which comprises at least one electroactive material or at least one electrode material. As used herein the term "organic material" may refer to either small molecular organic compounds, or high molecular organic compounds, including but not limited to dendrimers, or large molecular polymers, including oligomers with a number of repeat unit ranging from 2 to 10, and polymers with a number of repeat unit greater than 10.

As used herein, the term "disposed over" or "deposited over" refers to disposed or deposited directly on top of and in contact with, or disposed or deposited on top of but with intervening layers therebetween.

The term "alkyl" as used in the various embodiments of the present invention is intended to designate linear alkyl, branched alkyl, aralkyl, cycloalkyl, bicycloalkyl, tricycloalkyl and polycycloalkyl radicals comprising carbon and hydrogen atoms, and optionally containing atoms in addition to carbon and hydrogen, for example atoms selected from Groups 15, 16 and 17 of the Periodic Table. Alkyl groups may be saturated or unsaturated, and may comprise, for example, vinyl or allyl. The term "alkyl" also encompasses that alkyl portion of alkoxide groups. Unless otherwise noted, in various embodiments normal and branched alkyl radicals are those containing from 1 to about 32 carbon atoms, and comprise as illustrative non-limiting examples $C_1$-$C_{32}$ alkyl (optionally substituted with one or more groups selected from $C_1$-$C_{32}$ alkyl, $C_3$-$C_{15}$ cycloalkyl or aryl); and $C_3$-$C_{15}$ cycloalkyl optionally substituted with one or more groups selected from $C_1$-$C_{32}$ alkyl or aryl. Some illustrative, non-limiting examples comprise methyl, ethyl, n-propyl, isopropyl, n-butyl, sec-butyl, tertiary-butyl, pentyl, neopentyl, hexyl, heptyl, octyl, nonyl, decyl, undecyl and dodecyl. Some particular illustrative non-limiting examples of cycloalkyl and bicycloalkyl radicals comprise cyclobutyl, cyclopentyl, cyclohexyl, methylcyclohexyl, cycloheptyl, bicycloheptyl and adamantyl. In various embodiments aralkyl radicals comprise those containing from 7 to about 14 carbon atoms; these include, but are not limited to, benzyl, phenylbutyl, phenylpropyl, and phenylethyl. The term "aryl" as used in the various embodiments of the present invention is intended to designate substituted or unsubstituted aryl radicals comprising from 6 to 20 ring carbon atoms. Some illustrative non-limiting examples of aryl radicals include $C_6$-$C_{20}$ aryl optionally substituted with one or more groups selected from $C_1$-$C_{32}$ alkyl, $C_3$-$C_{15}$ cycloalkyl, aryl, and functional groups comprising atoms selected from Groups 15, 16 and 17 of the Periodic Table. Some particular illustrative, non-limiting examples of aryl radicals comprise substituted or unsubstituted phenyl, biphenyl, tolyl, xylyl, naphthyl and binaphthyl.

In accordance with one embodiment of the present invention there is provided a cathode stack for electroactive devices, wherein the cathode stack includes at least one getter layer internal to the cathode stack. As used herein, the term "getter layer" refers to a barrier layer for oxygen and moisture capable of absorbing, blocking, consuming and/or reacting with the oxygen and moisture, which would otherwise permeate to layers beneath the getter layer. Referring to FIG. 1, a first exemplary embodiment of a cathode stack 10 including a plurality of cathode layers is illustrated. In the illustrated embodiment, a cathode stack 10 is shown to include an electron-injection layer 12, a capping layer 14 disposed over the electron injection layer 12, and a getter layer 16 disposed over the capping layer. An electron injection layer may aid the movement of electrons across an interface between a cathode and an adjacent material (not shown). In accordance with the present exemplary embodiment, the cathode stack 10 includes an internal getter layer 16, which prevents moisture and/or oxygen from reaching the electron-injection layer 12 through the capping layer 14. As will be discussed further below, by providing a getter layer 16 that is internal to the cathode stack, a more robust organic electronic device may be achieved.

In one example, a capping layer may be an electrically conductive layer. In a non-limiting example, the electron injection layer includes an electron injection material such as sodium fluoride, the capping layer includes a capping layer material such as aluminum, and the getter layer includes getter layer material such as calcium oxide. Additional materials may be used for the electron-injection layer 12, the capping layer 14 and the getter layer 16, as described further below. As will be appreciated by one skilled in the art, in alternate embodiments of the present invention, a greater number of electron injection layers, or capping layers or getter layers may be present.

In a cathode stack, in accordance with one embodiment of the present invention, at least a portion of the capping layer is disposed over at least a portion of the electron injection layer. In a further embodiment, at least a portion of the getter layer is disposed over at least a portion of the capping layer.

In one embodiment of the present invention, one or more layers of the cathode stack may be reflective to provide a cathode which is substantially reflective, such that when used in organic electroactive devices such as organic light emitting devices, the cathode stack, reflects light received from a light emitting layer back through the device to emerge on the anode side of the device. The term "substantially reflective" means reflecting at least 50 percent, preferably at least 80 percent, and more preferably at least 90 percent, of light in the visible wavelength range incident on the cathode stack at an incident angle of less than or equal to 10 degrees. In other embodiments, the cathode stack may be a substantially transparent cathode stack, to enable transmission of light received from a light emitting layer. The term "substantially transparent" means allowing at least 50 percent, preferably at least 80 percent, and more preferably at least 90 percent, of light in the visible wavelength range transmitted through the cathode stack at an incident angle of less than or equal to 10 degrees. The thickness of one or more of the cathode stack layers may be selected to provide the desired optical transparency.

Suitable electron injection layer materials include, alkali metals, alkaline earth metals, alkali halides such as sodium fluoride and potassium fluoride, and alkaline earth halides such as magnesium fluoride.

Non-limiting examples of capping layer material include metals such as Al, Ag, Au, In, Sn, Zn, Zr, Sc, Y, Mn, Pb, lathanide series metals mixtures thereof and alloys thereof.

Suitable getter layer materials include metals such as but not limited to calcium, barium, strontium, and magnesium, and metal oxides such as calcium oxide, strontium oxide, barium oxide and magnesium oxide. In one embodiment, the selection of the getter layer material may depend on the material's ability to effectively stop migration of moisture and oxygen to subsequent layers.

Other suitable materials which may be used in cathode stacks include but are not limited to indium tin oxide, tin oxide, indium oxide, zinc oxide, indium zinc oxide, zinc indium tin oxide, antimony oxide, carbon nanotubes, and mixtures thereof.

Figure 2:
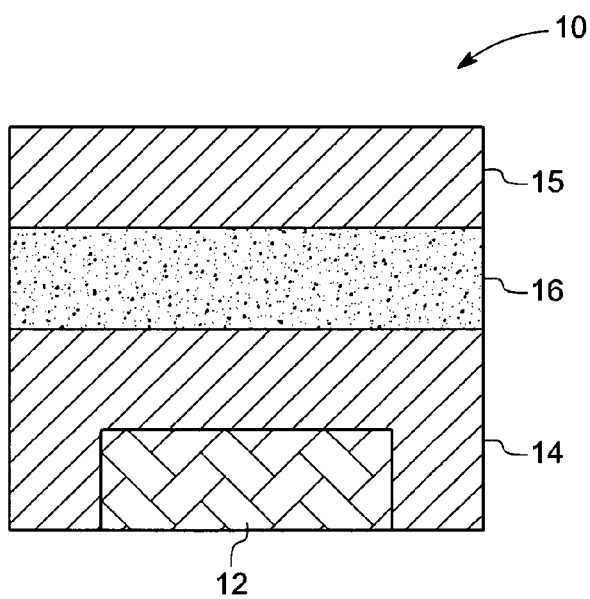
FIG. 2 is a cross-sectional representation of another exemplary embodiment of a cathode stack, according to aspects of the present technique.

In accordance with another embodiment of the present invention, the cathode stack includes at least one getter layer sandwiched between two capping layers. Referring to FIG. 2, another exemplary embodiment of a cathode stack 10 is illustrated. In the illustrated embodiment, cathode stack 10 is shown to include a first electron-injection layer 12, and a getter layer 16 disposed between two capping layers 14, and 15. As will be appreciated, the exemplary embodiment of FIG. 2 may be suitable for applications where it may be advantageous to protect the getter layer by having a capping layer over it.

Figure 3:
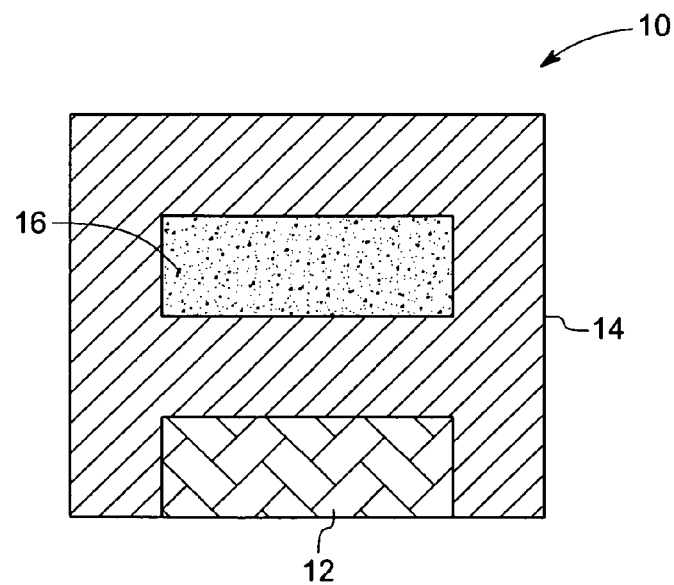
FIG. 3 is a cross-sectional representation of another exemplary embodiment of a cathode stack, according to aspects of the present technique.

In accordance with still another embodiment of the present invention, the cathode stack includes at least one getter layer embedded in a capping layer. Referring to FIG. 3, still another exemplary embodiment of a cathode stack 10 is illustrated. In the illustrated embodiment, cathode stack 10 is shown to include a first electron-injection layer 12, and a getter layer 16 embedded in a capping layer 14. In some embodiments, the capping layer surrounds two or more sides of a getter layer. In some other embodiments, a capping layer may encapsulate one or more getter layers. In some further embodiments, two or more getter layers or regions may be embedded in a capping layer.

Figure 4:
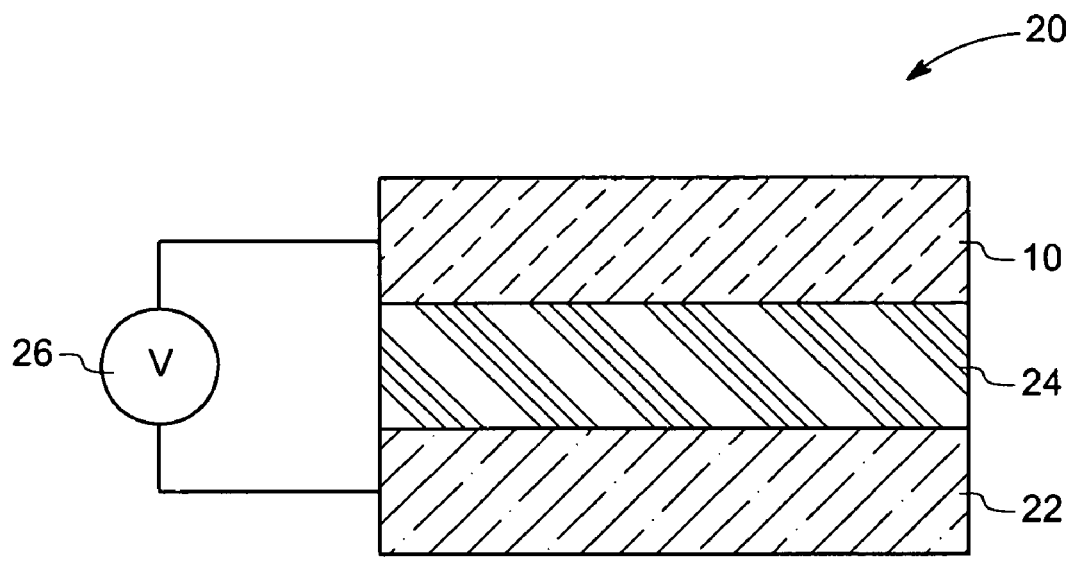
FIG. 4 is a cross-sectional representation of another exemplary embodiment of an organic light emitting device including a cathode stack, according to aspects of the present technique.

In accordance with one embodiment of the present invention there is provided an organic electroactive device including a cathode stack with at least one getter layer. Referring to FIG. 4, a first exemplary embodiment of an organic electroactive device 20 is illustrated. In the illustrated embodiment, the organic electroactive device 20 includes an electroactive layer 24 disposed over an anode layer 22 and a cathode stack 10 with a getter layer disposed over an electroactive layer 24. The cathode stack includes at least one electron injection layer, at least one capping layer and at least one getter layer and may comprise any of the configurations described above with regard to FIGS. 1-3. As will be appreciated by one skilled in the art, in alternate embodiments of the present invention, a greater number of electroactive layers may be present.

Non-limiting examples of electroactive layers include an electron transport layer, a hole transport layer, a hole injection layer, a hole injection enhancement layer, an electron injection enhancement layer, a photoabsorption layer, a photoluminescent layer, an electrode layer, and an electroluminescent layer.

In one embodiment, the organic electroactive device is an organic electroactive device including at least one organic electroactive layer. Non-limiting examples of organic electroactive devices include organic light emitting devices and organic photovoltaic devices. In one embodiment, the electroactive layer 24 is a light emitting layer, such that upon application of voltage from a power source 26, electrons and holes are injected through the cathode stack 10 and anode 22 respectively, which combine at the light emitting or electroluminescent layer, resulting in emission of light, as will be appreciated by those skilled in the art.

In one embodiment, the electron injection layer thickness is in a range from about 0.1 to about 100 nanometers. In certain embodiments, the electron injection layer thickness is in a range from about 0.1 to about 10 nanometers.

In one embodiment, the capping layer thickness is in a range from about 20 to about 200 nanometers. In certain embodiments, the capping layer thickness is in a range from about 20 to about 100 nanometers.

In one embodiment, the getter layer thickness is in a range from about 10 to about 100 nanometers. In some embodiments, the capping layer thickness is in a range from about 30 to about 60 nanometers.

Figure 5:
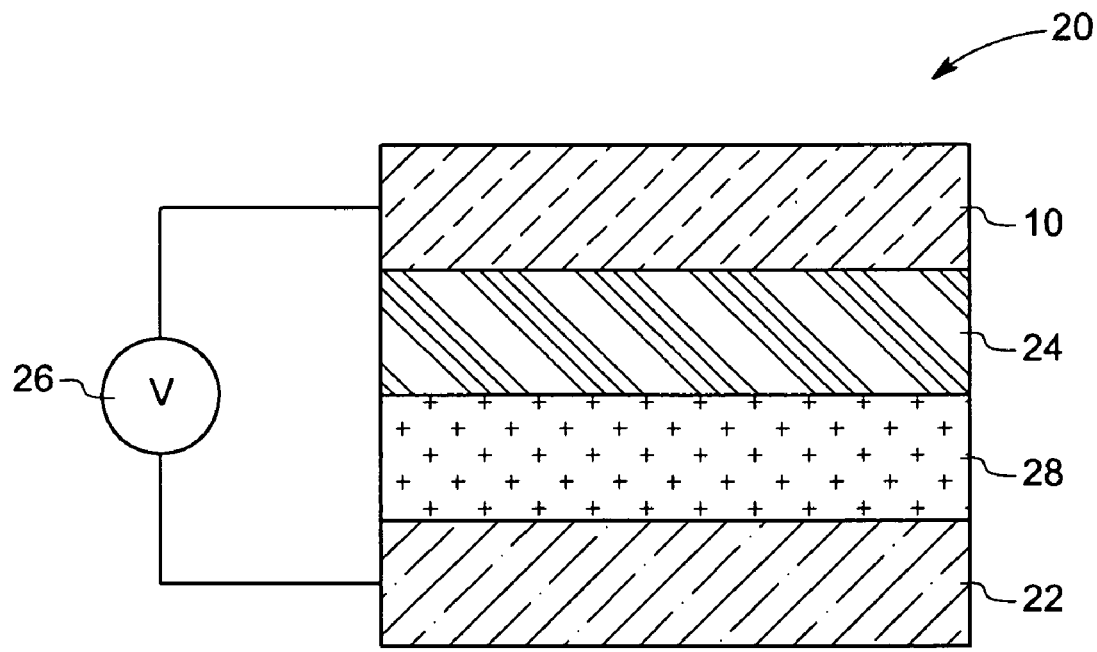
FIG. 5 is a cross-sectional representation of another exemplary embodiment of an organic light emitting device including a cathode stack, according to aspects of the present technique.

Referring to FIG. 5, another exemplary embodiment of an organic electroactive device 20 including a cathode stack 10 is illustrated. In the illustrated embodiment, the organic electroactive device 20 includes electroactive layers 24 and 28 disposed between an anode layer 22 and the cathode stack 10. The cathode stack includes at least one electron injection layer, at least one capping layer and at least one getter layer and may comprise any of the configurations described above with regard to FIGS. 1-3. In a non-limiting example, the electron injection layer is a sodium fluoride layer, the capping layer is an aluminum layer, and the getter layer is a calcium layer. In a non-limiting example, the electroactive layer 24 is a light emitting layer and the electroactive layer 28 is a hole-transport layer. In one embodiment, the anode layer is a substantially transparent layer.

Figure 6:
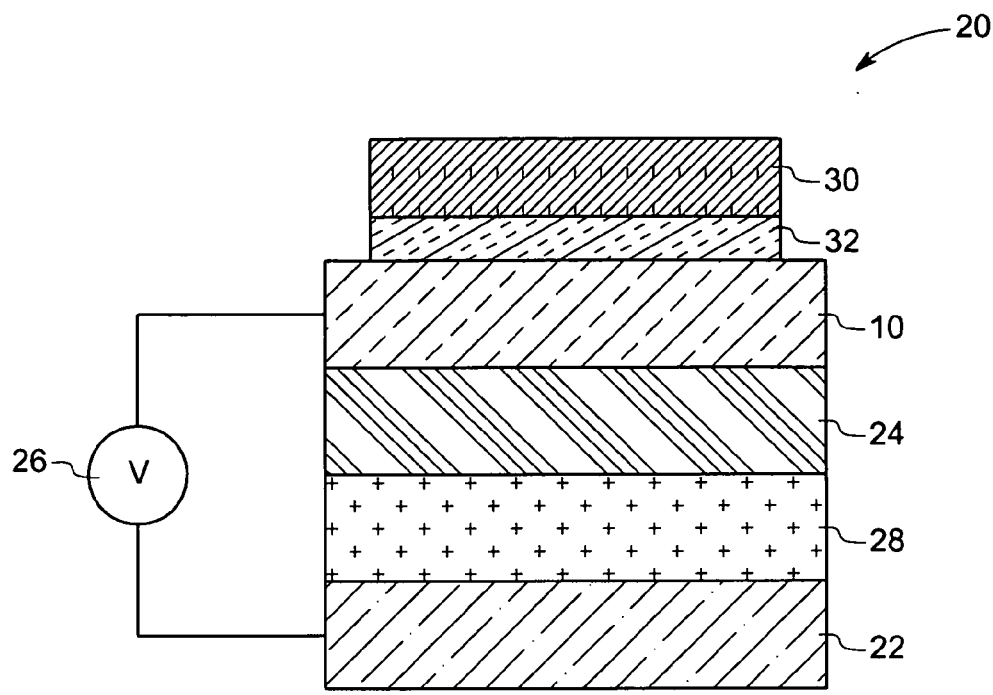
FIG. 6 is a cross-sectional representation of another exemplary embodiment of an organic light emitting device including a cathode stack, according to aspects of the present technique.

Referring to FIG. 6, still another exemplary embodiment of an organic electroactive device 20 including a cathode stack is illustrated. In the illustrated embodiment, the organic electroactive device 20 includes electroactive layers 24 and 28 disposed between an anode layer 22 and the cathode stack 10. This embodiment further includes a cover glass or metal foil 30 disposed over the cathode stack. The cover glass or metal foil 30 may be adhered to the cathode stack 10 using adhesive 32. The cathode stack includes at least one electron injection layer, at least one capping layer and at least one getter layer and may comprise any of the configurations described above with regard to FIGS. 1-3.

Figure 7:
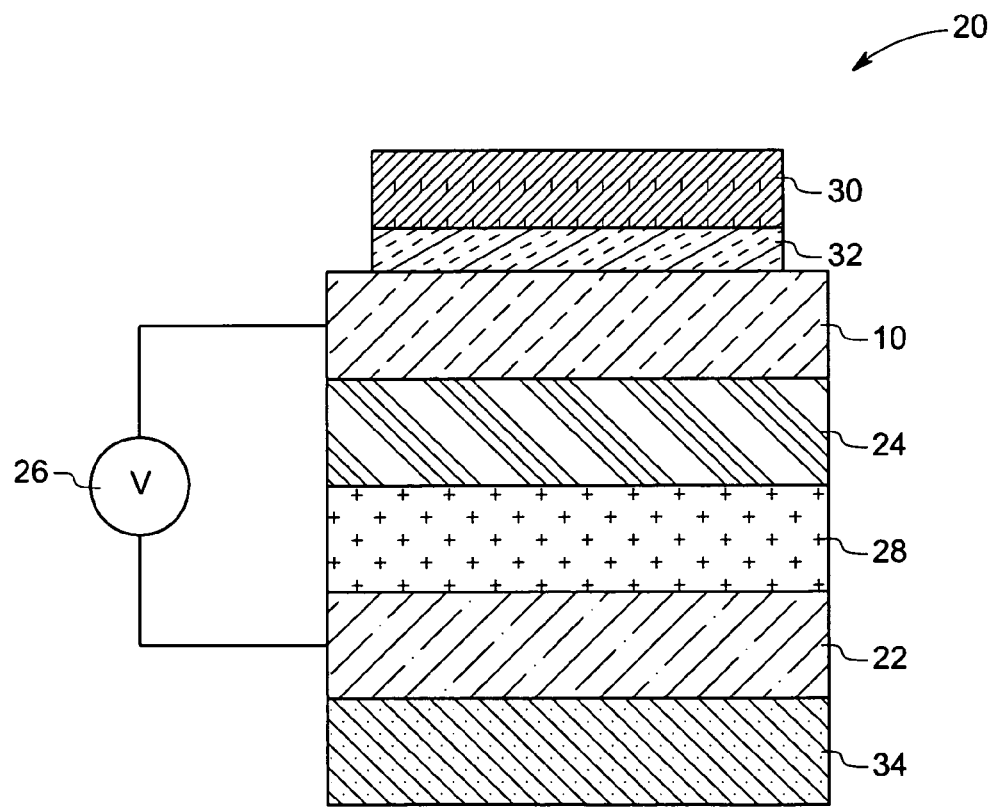
FIG. 7 is a cross-sectional representation of another exemplary embodiment of an organic light emitting device, according to aspects of the present technique.

Referring to FIG. 7, another exemplary embodiment of an organic electroactive device 20 including a cathode stack 10 is illustrated. In the illustrated embodiment, the organic electroactive device 20 includes electroactive layers 24 and 28 disposed between an anode layer 22 and the cathode stack 10. The cathode stack 10 comprises at least one getter layer and may comprise any of the configurations described above with regard to FIGS. 1-3. The device 20 includes a cover glass or metal foil 30 disposed over the cathode stack 10. The cover glass or metal foil 30 may be adhered to the cathode stack 10 using adhesive 32. The device further includes substrate 34. For example, the substrate is a layer of glass. In some embodiments, the anode and substrate may be present as a combination layer. In one embodiment, the substrate is a substantially transparent substrate. In one embodiment of the present invention, is an organic light emitting device (OLED) including a cathode stack with a getter layer having an operational lifetime greater than about 1000 hours. The operational lifetime (also referred to as the half-decay time) of an OLED device is defined as the time when its brightness has decreased to 50% of the initial brightness value.

Non-limiting examples of charge transport layer materials, which may be used in hole or electron transport layers include low-to-intermediate molecular weight (for example, less than about 200,000) organic molecules, poly (3,4-ethylenedioxythiophene) (PEDOT), polyaniline, poly (3,4-propylenedioxythiophene) (PProDOT), polystyrenesulfonate (PSS), polyvinyl), and like materials, and combinations thereof.

Non-limiting examples of hole transport layer materials include triaryldiamine, tetraphenyldiamine, aromatic tertiary amines, hydrazone derivatives, carbazole derivatives, triazole derivatives, imidazole derivatives, oxadiazole derivatives having an amino group, polythiophenes, and like materials. Suitable materials for a hole blocking layer comprise carbazole (PVK poly(N-vinyl carbazole), and like materials and combinations thereof.

Non-limiting examples of hole injection enhancement layer materials include arylene-based compounds such as 3,4,9,10-perylenetetra-carboxylic dianhydride, bis(1,2,5-thiadiazolo)-p-quinobis(1,3-dithiole), and like materials and combinations thereof.

Materials suitable for the electron injection enhancement layer materials and electron transport layer materials include metal organic complexes such as oxadiazole derivatives, perylene derivatives, pyridine derivatives, pyrimidine derivatives, quinoline derivatives, quinoxaline derivatives, diphenylquinone derivatives, nitro-substituted fluorene derivatives, or like materials or combinations thereof.

Non-limiting examples of materials which may be used in light emitting layers include poly(N-vinylcarbazole) (PVK) and its derivatives; polyfluorene and its derivatives such as poly(alkylfluorene), for example poly(9,9-dihexylfluorene), poly(dioctylfluorene) or poly {9,9-bis(3,6-dioxaheptyl)-fluorene-2,7-diyl}, poly(para-phenylene) (PPP) and its derivatives such as poly(2-decyloxy-1,4-phenylene) or poly (2,5-diheptyl-1,4-phenylene); poly(p-phenylene vinylene) (PPV) and its derivatives such as dialkoxy-substituted PPV and cyano-substituted PPV; polythiophene and its derivatives such as poly(3-alkylthiophene), poly(4,4'-dialkyl-2,2'-bithiophene), poly(2,5-thienylene vinylene); poly(pyridine vinylene) and its derivatives; polyquinoxaline and its derivatives; and polyquinoline and its derivatives. In one particular embodiment a suitable light emitting material is poly(9,9-dioctylfluorenyl-2,7-diyl) end capped with N,N-bis(4-methylphenyl)-4-aniline. Mixtures of these polymers or copolymers based on one or more of these polymers and other like polymers may also be used.

Another class of suitable materials used in light emitting layers are polysilanes. Typically, polysilanes are linear silicon-backbone polymers substituted with a variety of alkyl and/or aryl side groups. They are quasi one-dimensional materials with delocalized sigma-conjugated electrons along polymer backbone chains. Examples of polysilanes comprise poly(di-n-butylsilane), poly(di-n-pentylsilane), poly(di-n-hexylsilane), poly(methylphenylsilane), and poly{bis(p-butylphenyl)silane}.

Suitable anode materials for organic electroactive devices typically include those having a high work function value. Non-limiting examples of anode materials include, but are not limited to, indium tin oxide (ITO), tin oxide, indium oxide, zinc oxide, indium zinc oxide, nickel, gold, and like materials and combinations thereof.

Non limiting examples of substrates include thermoplastic polymers, poly(ethylene terephthalate), poly(ethylene naphthalate), polyethersulfone, polycarbonate, polyimide, acrylate, polyolefin, glass, metal, and like materials, and combinations thereof.

Organic electroactive devices of the present invention may include additional layers such as, but not limited to, one or more of an abrasion resistant layer, an adhesion layer, a chemically resistant layer, a photoluminescent layer, a radiation-absorbing layer, an electrochromic layer, a photochromic layer, a radiation reflective layer, a barrier layer, a planarizing layer, an optical diffusing layer, and combinations thereof.

In some embodiments of the present invention, the organic electroactive device has a tandem structure, wherein a plurality of OLEDs are stacked together. For example, a first OLED and a second OLED are stacked together, configured to couple light out through the substrate of the first OLED. The cathode of the first OLED, which can be a thin layer of metal such as Na, Li, is configured to be at least partially transparent, so that light emitted by the second OLED is transmitted through the first OLED to emerge out through the substrate of the first OLED along with the light emitted by the first OLED. The getter layer is placed as part of the cathode stack in the second OLED.

One embodiment of the present invention is a method of making a cathode stack. The method includes providing an electron injection layer, a capping layer and a getter layer in a stacked structure for example, as shown in FIGS. 1, 2 and 3. In some embodiments, at least a portion of the capping layer is disposed to be in contact with at least a portion of the electron injection layer, and at least a portion of the getter layer is disposed to be in contact with at least a portion of the capping layer.

In still another embodiment of the present invention is a method of fabricating an electroactive device with a cathode stack including a getter layer. The method includes providing a substrate and disposing or depositing at least one electroactive layer over the substrate. The substrate may be subjected to UV/ozone surface treatment prior to deposition of subsequent layers. Non-limiting examples of a substrate are an ITO or polymeric substrates. The method further includes disposing or depositing a cathode stack over an electroactive layer as shown in FIGS. 4-7. In one embodiment, the cathode stack may be deposited by first depositing an electron injection layer over the substrate with the electroactive layer, then depositing a capping layer, and depositing over the capping layer, a getter layer. In a further embodiment, an additional capping layer is deposited over the getter layer, such that the getter layer is sandwiched between two capping layers, as shown in FIG. 2 In other embodiments, masking techniques may be used to deposit the getter later over the capping layer, such that after additional deposition of the capping layer material over the getter layer, the getter layer is embedded or encapsulated in capping layer material as shown in FIG. 3. Advantageously, the use of a getter layer in a cathode stack enables the fabrication of the whole organic electroactive device in vacuum, avoiding exposure of the reactive cathode materials to the ambient.

The method may further comprise disposing over the substrate a hole transport layer material, a hole injection layer material, an electron transport layer material, an electron injection layer material, a photoabsorption layer material, a cathode layer material, an anode layer material or an electroluminescent layer material, or any combinations thereof.

As used herein, device sub-structures may include one or more substrate layers, one or more electrode layers, one or more electroactive layers, or one or more additional layers such as but not limited to adhesion layers, and barrier layers. In some embodiments, two or more device sub-structures may be deposited or disposed over each other to form an organic electroactive device. In further embodiments, two or more device sub-structures may be combined to form an organic electroactive device using processes such as but not limited to lamination.

The method of depositing or disposing a layer comprises techniques such as but not limited to spin coating, dip coating, reverse roll coating, wire-wound or Mayer rod coating, direct and offset gravure coating, slot die coating, blade coating, hot melt coating, curtain coating, knife over roll coating, extrusion, air knife coating, spray, rotary screen coating, multilayer slide coating, coextrusion, meniscus coating, comma and microgravure coating, lithographic process, langmuir process and flash evaporation, vapor deposition, plasma-enhanced chemical-vapor deposition ("PECVD"), radio-frequency plasma-enhanced chemical-vapor deposition ("RF-PECVD"), expanding thermal-plasma chemical-vapor deposition ("ETPCVD"), sputtering including, but not limited to, reactive sputtering, electron-cyclotron-resonance plasma-enhanced chemical-vapor deposition ("ECRPECVD"), inductively coupled plasma-enhanced chemical-vapor deposition ("ICPECVD"), and like techniques, and combinations thereof.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner.

EXAMPLE

Three organic light-emitting devices (OLEDs), samples A, B, and C, were fabricated as follows. Glass pre-coated with indium tin oxide (ITO) (Applied Films) was used as substrates for all three samples. The ITO substrates were ozone treated. A layer of poly (3,4-ethylendioxythiophene/polystyrene sulfonate (PEDOT) (Bayer Corporation) of thickness about 65 nm was deposited onto each of the three ultraviolet-ozone treated ITO substrates via spin-coating and then baked for about 1 hour at about 180° C. in air. A layer of a green light-emitting polymer (LEP) (Lumation 1304 obtained from Dow Chemicals) of thickness about 65 nm was then spin-coated on to the PEDOT layer of all three samples. The three samples were then transferred into an argon filled glovebox with less than about 1 part per million (ppm) of oxygen and moisture. A bilayer stack of NaF (about 4 nm thick)/Al (about 100 nm thick) was thermally evaporated at a base vacuum of about $2\times10^{-6}$ torr on top of the LEP layer of all three samples. Next, a calcium (Ca) getter layer was thermally evaporated on top of the bilayer stack using the same evaporator without breaking the vacuum for samples B and C. The first device, sample A, was used as a control and did not have the Ca getter layer. In sample B, the Ca getter layer with a thickness of about 30 nm was covered by an Al layer of thickness about 100 nm. In sample C, the Ca getter layer with a thickness of about 60 nm was covered by an Al layer of thickness about 100 nm. All three samples, A, B, and C, were encapsulated using a glass slide sealed with a degassed optical clear adhesive (Norland optical adhesive 68 obtained from Norland Products, Cranbury, N.J., USA).

Figure 8:
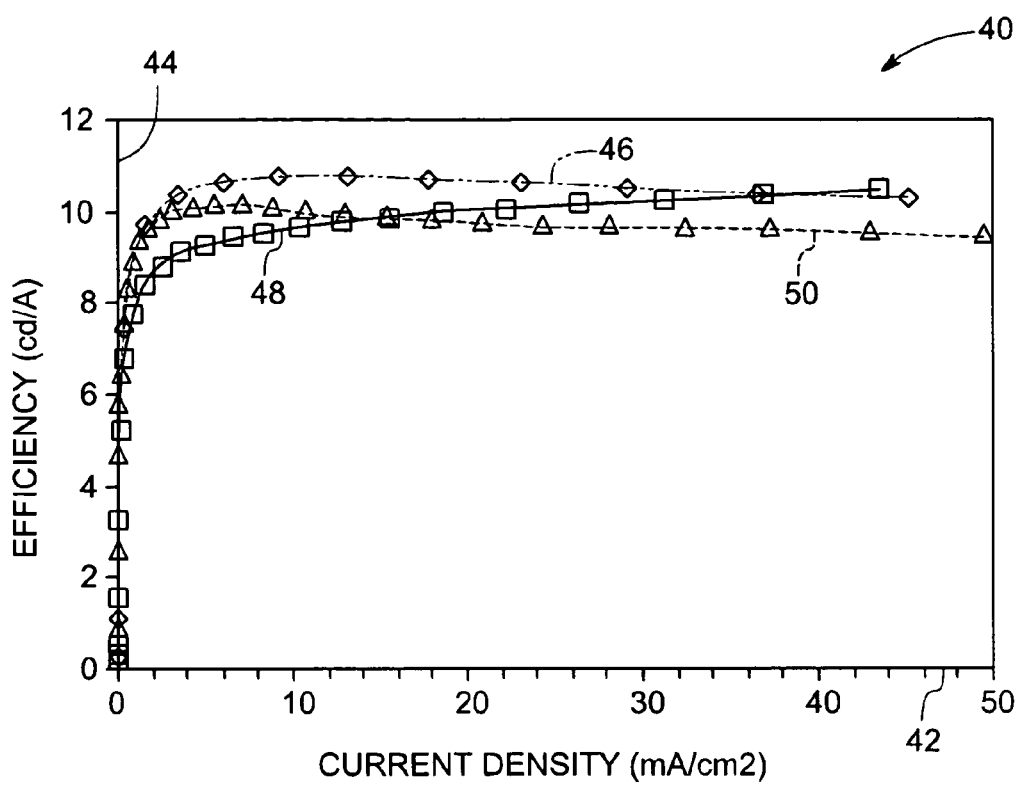
FIG. 8 is a graph illustrating variation in efficiency versus current density for organic light emitting devices according to aspects of the present technique.
Figure 9:
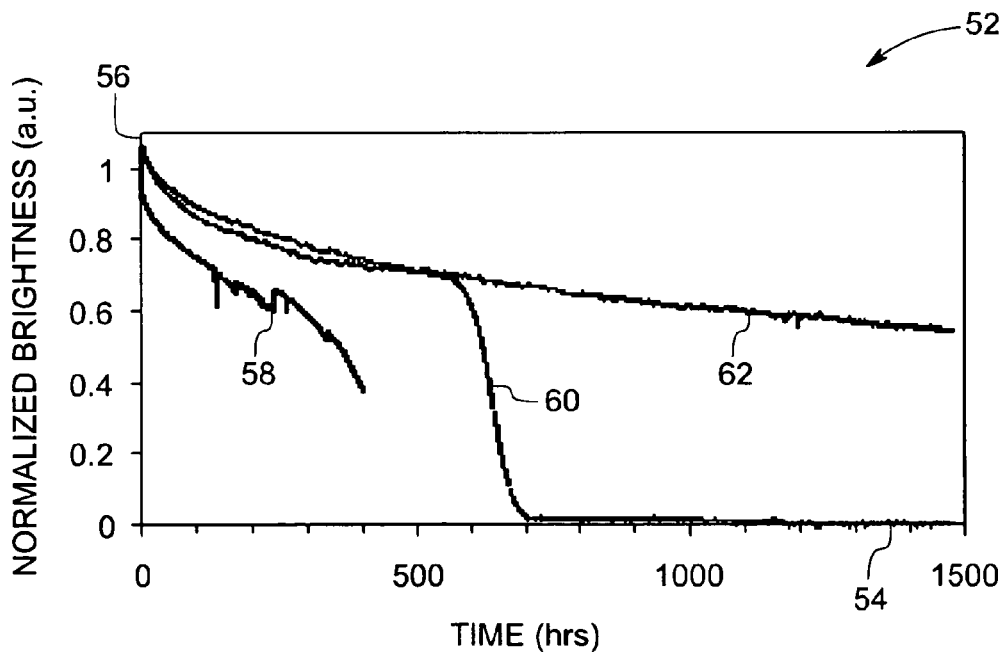
FIG. 9 is a graph illustrating the operational lifetime profiles for organic light emitting devices according to aspects of the present technique.

Electroluminescence efficiency of the OLED samples A, B, and C, was characterized by measuring their current-voltage-brightness characteristics. Plot 40 shown in FIG. 8 illustrates the variation in efficiency 44 as a function of current density 42. The efficiency 44 versus current density 42 profiles for samples A (46), B (48), and C (50), are similar, indicating that the introduction of the getter layer had no adverse effects on the device efficiency as all samples, A, B, and C have identical NaF/Al bilayer stacks.

Operational lifetime and long-term stability of the three OLED samples A, B, and C were also measured. All samples were operated under a constant current density of 10 mA/cm$^2$, corresponding to an initial brightness of about 1000 candela/m$^2$ and their corresponding brightness was measured over time. The operational lifetime (also referred to as the half-decay time) of an OLED device is defined as the time when its brightness has decreased to 50% of the initial brightness value. A normalized brightness relative to the initial brightness (56) of each OLED sample as a function of operation time (54) is illustrated in plot 52 shown in FIG. 10. It can be seen that the decay profiles for sample B (60) and sample C (62), which include the Ca getter layer, exhibit slower decay rates (equivalently much longer operational lifetimes) relative to the decay profile (58) of control sample A, which does not have a getter layer. In addition, the device with a thicker (60 nm) Ca getter layer shows a slower decay rate relative to the one with a thinner (30 nm) Ca getter layer.

The previously described embodiments of the present invention have many advantages, including, providing cathode stacks for electro-active devices to enhance stability and increase operational lifetimes.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A cathode stack for organic electroactive devices comprising:
    an electron injection layer,
    a capping layer, and
    a getter layer, wherein the capping layer surrounds the getter layer from all sides and the capping layer is in contact with at least a portion of the electron injection layer.

2. The cathode stack of claim 1, wherein the getter layer is embedded in the capping layer.

3. The cathode stack of claim 1, wherein the getter layer is encapsulated by the capping layer.

4. The cathode stack of claim 1, wherein the electron injection layer comprises material comprising alkali metals, alkaline earth metals, alkali metal halides or alkaline earth halides or any combinations thereof.

5. The cathode stack of claim 1, wherein the electron injection layer comprises material comprising lithium, calcium, lithium fluoride, calcium fluoride, sodium fluoride, potassium fluoride and combinations thereof.

6. The cathode stack of claim 1, wherein the capping layer comprises Al, Ag, Au, In, Sn, Zn, Zr, Sc, Y, Mn, Pb, lathanide series metals, or any mixtures thereof or any alloys thereof.

7. The cathode stack of claim 1, wherein the getter layer comprises calcium, barium, strontium, magnesium, calcium oxide, strontium oxide, barium oxide or magnesium oxide or any combinations thereof.

8. An organic electroactive device comprising:
    at least one electroactive layer; and
    a cathode stack, wherein the cathode stack comprises:
    an electron injection layer;
    a capping layer; and
    a getter layer, wherein the capping layer surrounds the getter layer from all sides and the capping layer is in contact with at least a portion of the electron injection layer.

9. The organic electroactive device of claim 8, comprising an organic light emitting device.

10. The organic electroactive device of claim 8, comprising an organic photovoltaic device.

11. The organic electroactive device of claim 8, further comprising a hole transport layer, a hole injection layer, a hole injection enhancement layer, an electron transport layer, an electron injection enhancement layer, an electroluminescent layer, a photoabsorption layer, an anode layer, or a substrate layer or any combinations thereof.

12. The organic electroactive device of claim 8, further comprising an abrasion resistant layer, an adhesion layer, a chemically resistant layer, a photoluminescent layer, a radiation-absorbing layer, an electrochromic layer, a photochromic layer, a radiation reflective layer, a barrier layer, a planarizing layer, or an optical diffusing layer, or any combinations thereof.

13. The organic electroactive device of claim 8, wherein the electron injection layer has a thickness is in a range from about 0.1 to 100 nanometers.

14. The organic electroactive device of claim 8, wherein the capping layer has a thickness in a range from about 20 to 200 nanometers.

15. The organic electroactive device of claim 8, wherein the getter layer has a thickness in a range from about 10 to 200 nanometers.

16. A method of making a cathode stack, the method comprising:
   providing an electron injection layer, a capping layer, and a getter layer in a stacked structure;
   wherein the capping layer surrounds the getter layer from all sides and the capping layer is disposed in contact with at least a portion of the electron injection layer.

* * * * *